(12) United States Patent
Gorin

(10) Patent No.: US 7,015,415 B2
(45) Date of Patent: Mar. 21, 2006

(54) HIGHER POWER DENSITY DOWNSTREAM PLASMA

(75) Inventor: Georges J. Gorin, Novato, CA (US)

(73) Assignee: Dry Plasma Systems, Inc., Union City, CA (US)

(*) Notice: Subject to any disclaimer, the term of this patent is extended or adjusted under 35 U.S.C. 154(b) by 210 days.

(21) Appl. No.: 10/781,226

(22) Filed: Feb. 18, 2004

(65) Prior Publication Data

US 2005/0178746 A1    Aug. 18, 2005

(51) Int. Cl.
B23K 10/00    (2006.01)
(52) U.S. Cl. .................. 219/121.43; 219/121.41; 219/121.5; 156/345.38
(58) Field of Classification Search ........... 219/121.43, 219/121.48, 121.41, 121.44; 156/345.29, 156/345.22, 345.38; 315/111.21
See application file for complete search history.

(56) References Cited

U.S. PATENT DOCUMENTS

| | | | |
|---|---|---|---|
| 5,866,986 A | * | 2/1999 | Pennington ............ 315/111.21 |
| 5,976,992 A | | 11/1999 | Ui et al. |
| 6,112,696 A | | 9/2000 | Gorin |
| 6,167,835 B1 | | 1/2001 | Ootera et al. |
| 6,207,587 B1 | * | 3/2001 | Li et al. .................. 438/769 |
| 6,255,197 B1 | * | 7/2001 | Fujimura et al. .......... 438/475 |
| 6,263,831 B1 | | 7/2001 | Gorin |
| 6,267,074 B1 | | 7/2001 | Okumura |

FOREIGN PATENT DOCUMENTS

| | | |
|---|---|---|
| EP | 0388800 A3 | 9/1990 |
| EP | 0546852 A1 | 6/1993 |

* cited by examiner

Primary Examiner—Mark Paschall
(74) Attorney, Agent, or Firm—Kevin Roe

(57) ABSTRACT

A method and system to obtain a high power density plasma to efficiently generate high concentrations of plasma downstream from one or more plasma sources. A first embodiment of the invention involves a method to provide an improved power density for dissociating one or more gases to create plasma. A second embodiment of the invention involves a method to provide multiple chambers for dissociating one or more gases to create plasma. A third embodiment involves an apparatus using a constriction in a discharge chamber containing one or more gases, to provide an improved power density for dissociating one or more gases to create plasma. A fourth embodiment involves an apparatus using a constriction in multiple discharge chambers containing one or more gases, to provide an improved power density for dissociating one or more gases to create plasma.

28 Claims, 17 Drawing Sheets

HIGHER POWER DENSITY DOWNSTREAM PLASMA

BACKGROUND OF THE INVENTION

1. Field of the Invention

This invention relates to a plasma or a glow discharge for dissociating one or more gases into reactive and non-reactive ionic and reactive and non-reactive neutral species, and in particular, to improving the power density necessary to dissociate one or more gases for use in a plasma.

2. Description of the Prior Art

Plasma apparatus can be divided into two broad categories, downstream or remote plasma and direct plasma. In downstream plasma, the article(s) are not immersed in the glow discharge, as it is in direct plasma. The result is a somewhat more gentle treatment of the article(s) because high power electromagnetic waves at high frequency are not coupled through the article(s) and there is no heating from direct ion bombardment. In either type of apparatus, it is known in the art to employ some type of plasma for processing one or more article(s).

Typically, one or more reactive gases (such as, oxygen-based gases, or halogen-based gases, including fluorine, chlorine, bromine, or other equivalent gases, as well as gas molecular compounds having one or more oxygen or halogen atoms), are used in combination with other gases due to the highly reactive nature of the reactive gas(es), in a downstream plasma chamber. A problem with these additive gases is that the energy necessary to dissociate some additive gas molecules can be less than that energy necessary to dissociate the intended halogen-based gas molecule. In the discharge zone, the applied energy can be undesirably absorbed by gas molecules other than the reactive gas molecules intended for dissociation.

In the prior art, a power supply producing large amounts of microwave power was typically used to assure dissociation of one or more gases. Much of this power was wasted in recombination away from the one or more articles to be processed by the plasma. Often reactive ions attacked the chamber, or other components, thereby introducing undesirable contamination into the plasma process.

A problem with many gases is that these gas molecules diffuse everywhere, including their diffusion toward the source of the one more reactive gas sources to supply the plasma, thereby contaminating the reactive gas sources. While one could adjust the relative flows of the gases, the mixture would be determined by the diffusion problem, rather than by the most effective mixture for processing the one or more articles to be processed by the plasma.

Another problem with prior art plasma technology for multiple gas sources is that high power was consumed in order to dissociate each gas, and the operating temperatures of the plasma chambers could become sufficiently high to significantly decrease the reliability and/or significantly increase the cooling requirements. Large gas flows for plasma generation also required large amounts of power and could create these same problems.

In view of the foregoing, what is needed is an improved method and apparatus for efficiently dissociating one or more gases into a plasma with a higher power density, and producing reactive and non-reactive ionic species and reactive and non-reactive neutral species from one or more gases, without contaminating the one or more gas sources.

SUMMARY OF THE INVENTION

The present invention includes a constriction in the exhaust side of the discharge chamber or plasma chamber containing one or more gases, which localizes the plasma to the region of the constriction, increases the power density of the region, and isolates the plasma from the rest of the system. In one embodiment of the invention, one or more gases are dissociated. More than one gas can be combined in a chamber. In another embodiment, one or more inert gases and one or more reactive gases (e.g., a oxygen-based or halogen-based gas) with or without other gases or vapors are dissociated and then other gases or vapors (e.g., water vapor, or an equivalent vapor) are added and then another gas is added and the mixture is dissociated. The invention can be implemented in numerous ways, such as by a method, an apparatus, or a plasma system. Four aspects of the invention are described below.

A first aspect of the invention is directed to a method for treating one or more articles with a downstream plasma generated from dissociating one or more gases. The method includes supplying one or more gases from a source to a first chamber, including a means for controlling expansion of a plasma back through the source from the first chamber, applying RF power to dissociate one or more gases and create plasma having a power density, withdrawing one or more dissociated gases from the first chamber through a constriction sized to increase the power density of the plasma, and supplying one or more dissociated gases to a second chamber containing one or more articles.

A second aspect of the invention is directed to a method for treating one or more articles with a downstream plasma generated by dissociating one or more gases. The method includes supplying one or more gases from a first source to a first chamber, applying RF power to dissociate one or more gases in the first source and create a first plasma having a first power density, withdrawing the first plasma from the first chamber through a first constriction to increase the first power density of the first plasma, supplying one or more gases from a second source to a second chamber for RF power to dissociate one or more gases from the second source to create a second plasma having a second power density, using a second constriction to withdraw the second plasma one or more gases from the second chamber to increase the second power density of the second plasma, and supplying the first plasma from the first chamber and the second plasma from the second chamber to a third chamber containing one or more articles.

A third aspect of the invention is directed to an apparatus to dissociate one or more gases to produce a downstream plasma. The apparatus includes a first chamber with a first constriction, coupled to a first source of one or more gases, including a means for controlling expansion of a plasma in the first chamber back through the first port; one or more RF energy sources coupled to the first chamber; means for dissociating the one or more gases in the first chamber into a plasma having a power density, wherein the constriction increases the power density of the plasma; and a second chamber coupled to the first chamber, wherein the second chamber can contains one or more articles.

A fourth aspect of the invention is directed to an apparatus to dissociate one or more gases to produce a downstream plasma. The apparatus includes a first chamber with a first constriction, coupled to a first source of one or more gases; a second chamber with a second constriction, coupled to a second source of one or more gases; one or more RF energy sources coupled to the first chamber and the second chamber; means for dissociating the one or more gases from the first port into a first plasma having a first power density in the first chamber, wherein the first constriction increases the first power density, and means for dissociating one or more gases from the second port into a second plasma having a second power density in the second chamber, wherein the second constriction increases the second power density; and a third chamber coupled to the first chamber and the second chamber, wherein the third chamber can contain one or more articles.

These and other objects and advantages of the invention will become apparent to those skilled in the art from the following detailed description of the invention and the accompanying drawings.

DETAILED DESCRIPTION OF THE PREFERRED EMBODIMENT

The invention provides a method, an apparatus, and a system to obtain high power density plasma to efficiently generate high concentrations of reactive and non-reactive activated neutral atoms and molecules downstream from a plasma source. Various embodiments of the invention can be applied to biological applications, medical applications, chemical applications, electronic applications, and any other applications where plasma can be beneficially used. Inductive coupling or capacitive coupling can be used to couple radio-frequency (RF) electromagnetic energy to one or more gases for dissociation and creation of plasma. In this specification, drawings, and claims, radio-frequency (RF) is defined as any frequency of electromagnetic energy equal to or greater than 5000 cycles per second (Hertz).

In one embodiment of the invention, a constriction is used to generate a region of high power density, and a means of controlling the volume where the plasma is generated to prevent the plasma from expanding upstream. When multiple gas sources are used in one embodiment of the invention, the exhaust of the tubes from the sources are positioned in front of each other to help insure that the plasma strikes in every tube.

Figure 1A:
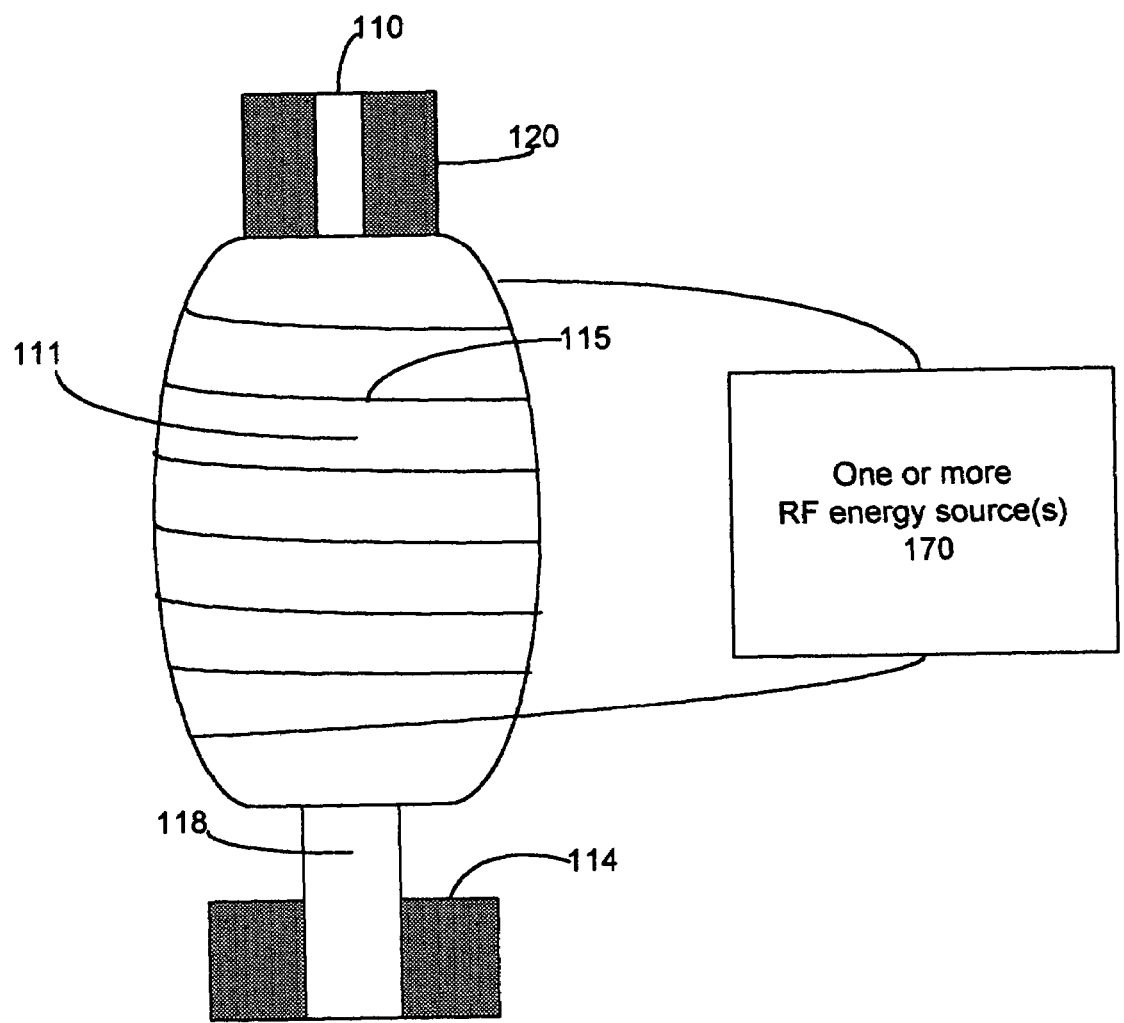
FIG. 1A illustrates a plasma generating apparatus constructed in accordance with one embodiment of the invention, which includes a gas inlet which supplies one or more gases to a discharge chamber, which also has a capillary tube to prevent plasma expansion into the gas inlet.

In FIG. 1A, one embodiment of the invention includes a gas inlet 120 which supplies one or more gases to discharge chamber 111. Discharge chamber 111 also has a capillary tube 110 to prevent plasma expansion into gas inlet 120. One or more radio-frequency (RF) energy sources 170 are coupled to inductor 115, which surrounds discharge chamber 111 and dissociates one or more gases passing through discharge chamber 111, which may be made of various materials (e.g., a dielectric material or an equivalent). Discharge chamber 111 is coupled to a second chamber (not shown) by output port 114. Discharge chamber 111 is coupled to output port 114 by constriction 118 to achieve a high power density. In accordance with one embodiment of the invention, constriction 118 has a diameter that is a function of the power density required, and the total gas flow required to obtain the desired reaction rate (e.g., ashing, cleaning, sterilization, surface modification, and other equivalent plasma processes). In alternative embodiments of the invention, one or more constrictions 118 can be used for the same chamber, each having an inside diameter ranging from one millimeter (mm) to less than 19 millimeters, and a length substantially equal to or greater than one millimeter. In one embodiment, an insert as simple as a cylindrical disk with one or more holes drilled parallel to its cylindrical axis can provide one or more constrictions. Alternative embodiments have multiple inserts.

Figure 1B:
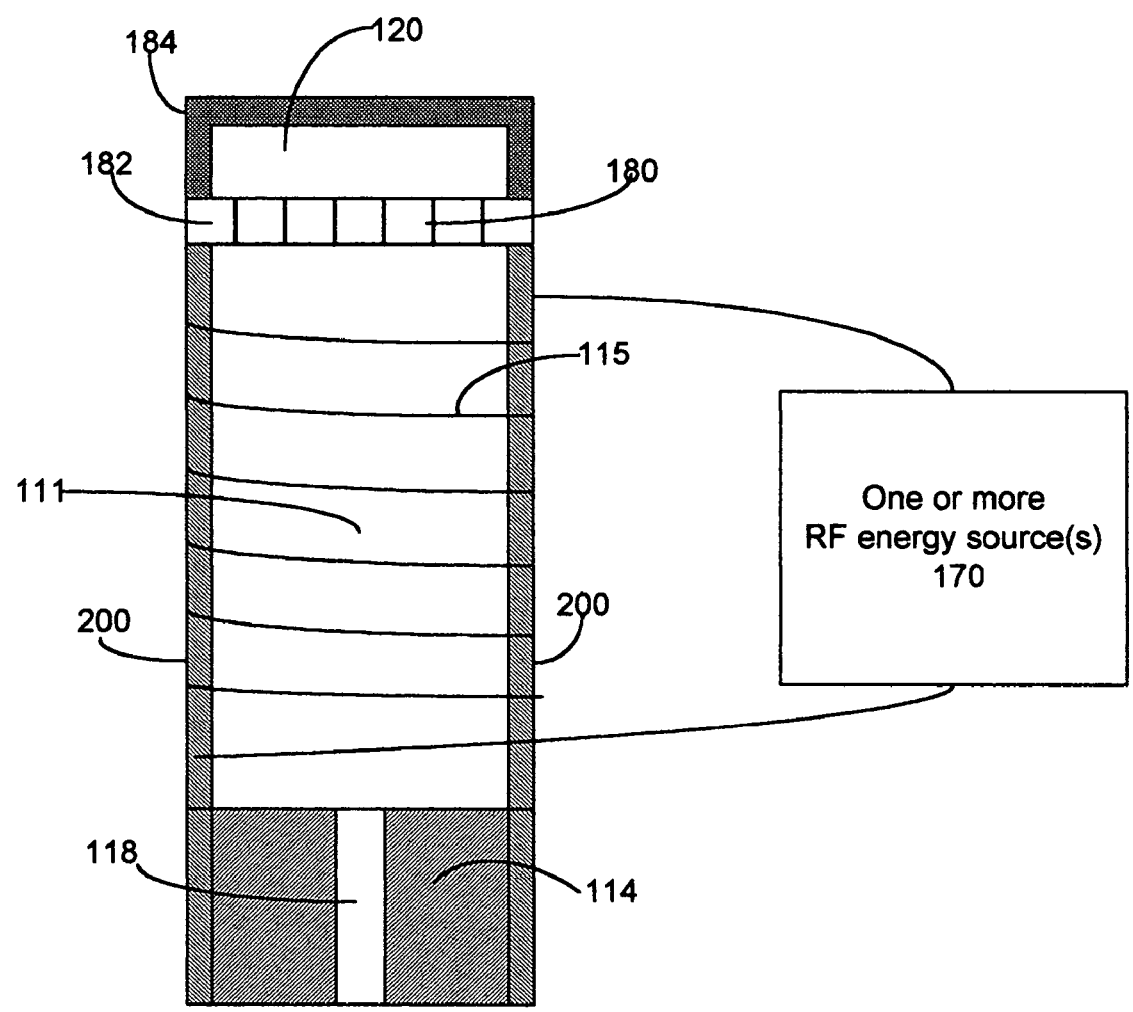
FIG. 1B illustrates a plasma generating apparatus constructed in accordance with an alternative embodiment the invention, which has a gas inlet which supplies one or more gases to discharge chamber, and small holes to prevent plasma expansion upstream from the discharge chamber through the gas inlet.

In FIG. 1B, an alternative embodiment of the invention has a gas inlet 120 which supplies one or more gases to discharge chamber 111. A metal or dielectric material 184 encloses gas inlet 120 and a dielectric layer 182 has small openings (e.g., holes, slots, or equivalent perforations) 180 to prevent plasma expansion upstream from discharge chamber 111 through gas inlet 120. One or more RF energy sources 170 are coupled to inductor 115, which surrounds discharge chamber 111 and dissociates one or more gases passing through discharge chamber 111. The discharge chamber walls 200 may be made of various materials (e.g., a dielectric material such as, ceramic, glass, or an equivalent). Discharge chamber 111 is coupled to a second chamber (not shown) by output port 114. Discharge chamber 111 is coupled to output port 114 by constriction 118 to achieve a high power density. Constriction 118 in one embodiment is within a removable insert, which can allow the constriction 118 to be disposable, easier to clean, and/or within a different material than the discharge chamber material. The material used for constructing the constriction 118 in alternative embodiments can either be reactive or un-reactive with the plasma, as desired.

Figure 2A:
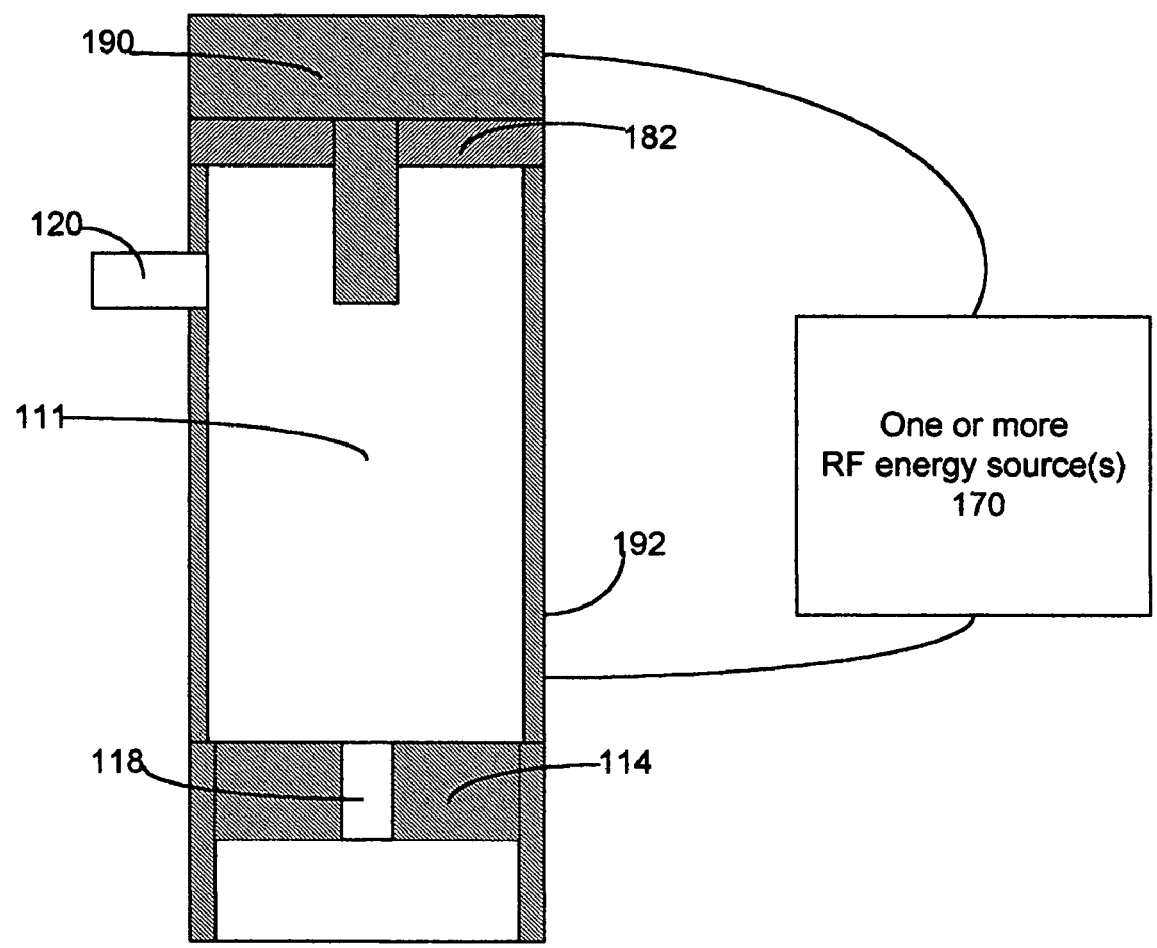
FIG. 2A illustrates a plasma generating apparatus constructed in accordance with an alternative embodiment of the invention, which has a gas inlet which supplies one or more gases to a discharge chamber also having a dielectric layer between the discharge chamber and a first electrode and a second electrode that are connected to one or more RF energy sources.

In FIG. 2A, gas inlet 120 with a means to control backwards plasma expansion supplies one or more gases to discharge chamber 111. Discharge chamber 111 also has a dielectric layer 182 between the discharge chamber 111 and a protruding first electrode 190. Both the first electrode 190 and a second electrode 192 are connected to one or more RF energy sources 170. One or more RF energy sources 170 provide the power to dissociate one or more gases passing through discharge chamber 111. Discharge chamber 111 is coupled to a second chamber (not shown) by output port 114. Discharge chamber 111 is coupled to output port 114 by constriction 118 to achieve a high power density. Constriction 118 in one embodiment is within a removable insert, which can allow the constriction to be disposable, easier to clean, and/or a different material than the material of output port 114. The material used for constructing the constriction 118 can either be reactive or non-reactive with the plasma, as desired. In alternative embodiments of the invention the constriction 118 and output port 114 are a one-piece insert, including a reactive or non-reactive material.

Figure 2B:
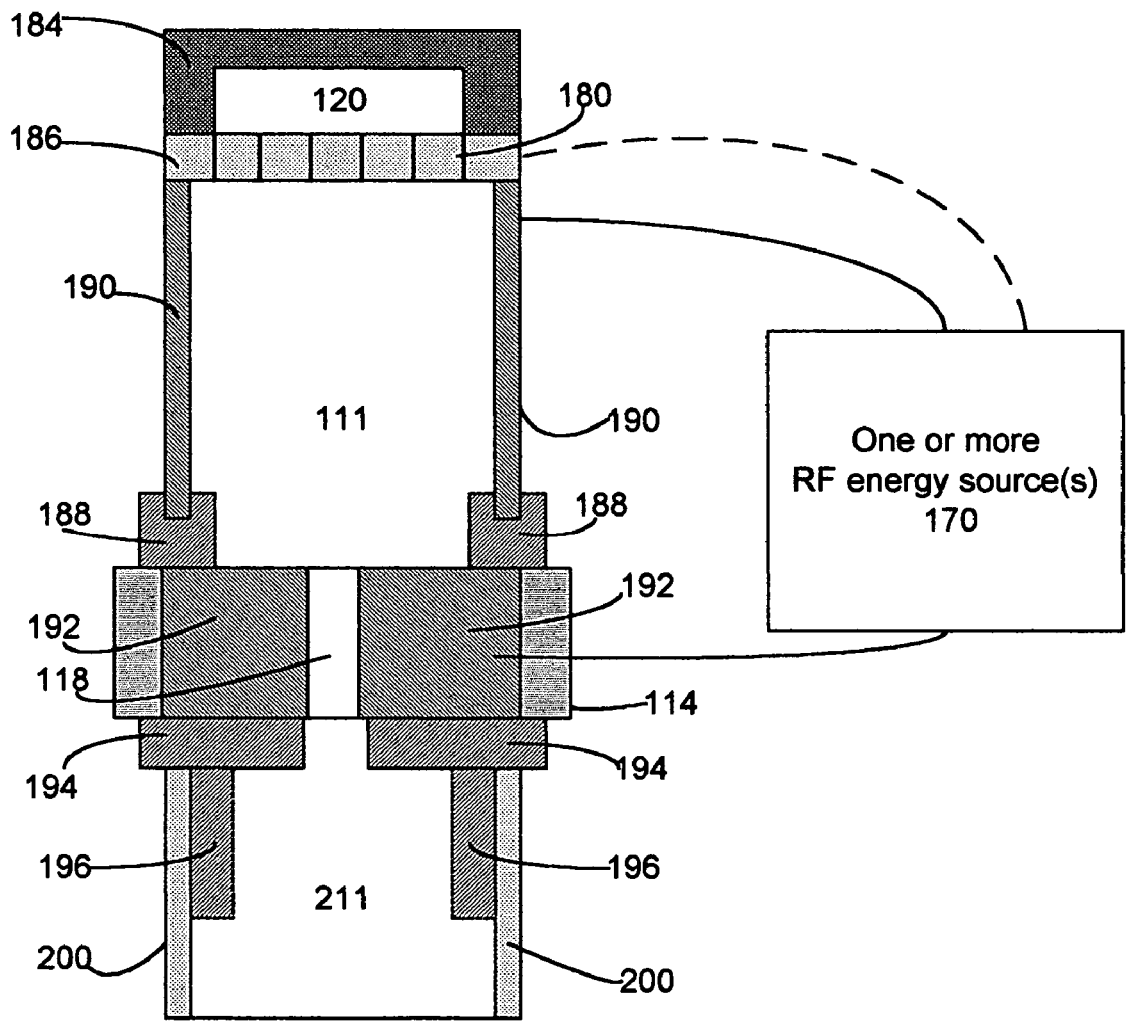
FIG. 2B illustrates a schematic cross-section of downstream plasma apparatus in accordance with an alternative embodiment of the invention, which has a discharge chamber, which also has a dielectric layer between the discharge chamber and a first electrode and a second electrode that are connected to one or more RF energy sources.

In FIG. 2B, metal or dielectric material 184 encloses a gas inlet 120 which supplies one or more gases to discharge chamber 111. Small openings 180 in material 186 (comprising an optional metal electrode or dielectric material) prevent plasma expansion upstream from discharge chamber 111 through gas inlet 120. Discharge chamber 111 also has a first electrode 190 and a second electrode 192 that are connected to one or more RF energy sources 170. Dielectric material 188 separates first electrode 190 and second electrode 192. One or more RF energy sources 170 provide the power to dissociate one or more gases passing through discharge chamber 111. Discharge chamber 111 is coupled to a second chamber 211 by constriction 118 (to achieve a high power density plasma) and second electrode 192 within output port 114. Adjacent to output port 114 are dielectric material 194, and optional dielectric material 196 to control plasma extension downstream. The second discharge chamber 211 in alternative embodiments can be constructed with walls 200 made of various materials (e.g., a metal, or a dielectric material such as, ceramic, glass, or an equivalent). Constriction 118 in one embodiment is within a removable insert, which can allow the constriction 118 to be disposable, easier to clean, and/or within a different material than the discharge chamber material. The material for constructing constriction 118 can include material either reactive or un-reactive with the plasma, in alternative embodiments.

Figure 2C:
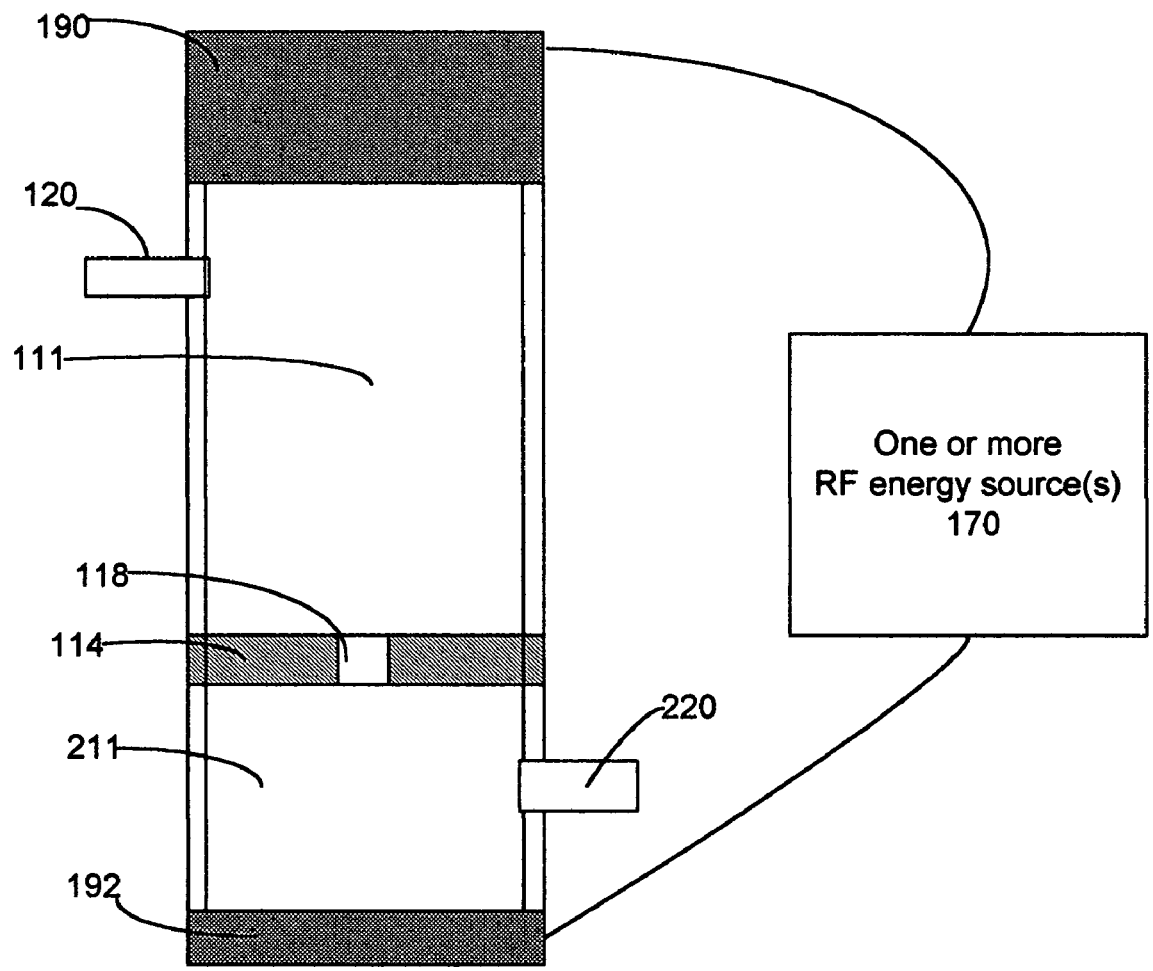
FIG. 2C illustrates a plasma generating apparatus constructed in accordance with an alternative embodiment the invention, which has a discharge chamber coupled to a second chamber by output port, and one or more gases leave the second chamber by a gas outlet.

In FIG. 2C, gas inlet 120 supplies one or more gases to discharge chamber 111. Discharge chamber 111 is coupled to a second chamber 211 by output port 114, and one or more gases leave second chamber 211 by gas outlet 220. Discharge chamber 111 also has a first electrode 190 and a second electrode 192 that are connected to one or more RF energy sources 170. One or more RF energy sources 170 provide the power to dissociate one or more gases passing through discharge chambers 111 and 211. Discharge chamber 111, may be enclosed by various materials (e.g., a dielectric material such as, ceramic, glass, or an equivalent). Discharge chamber 111 is coupled to output port 114 by constriction 118 to achieve a high power density. Constriction 118 in one embodiment is within a removable insert, which can allow the constriction 118 to be disposable, easier to clean, and/or within a different material than the discharge chamber material. The material for constructing the constriction can either be reactive or un-reactive with the plasma, as desired.

Figure 2D:
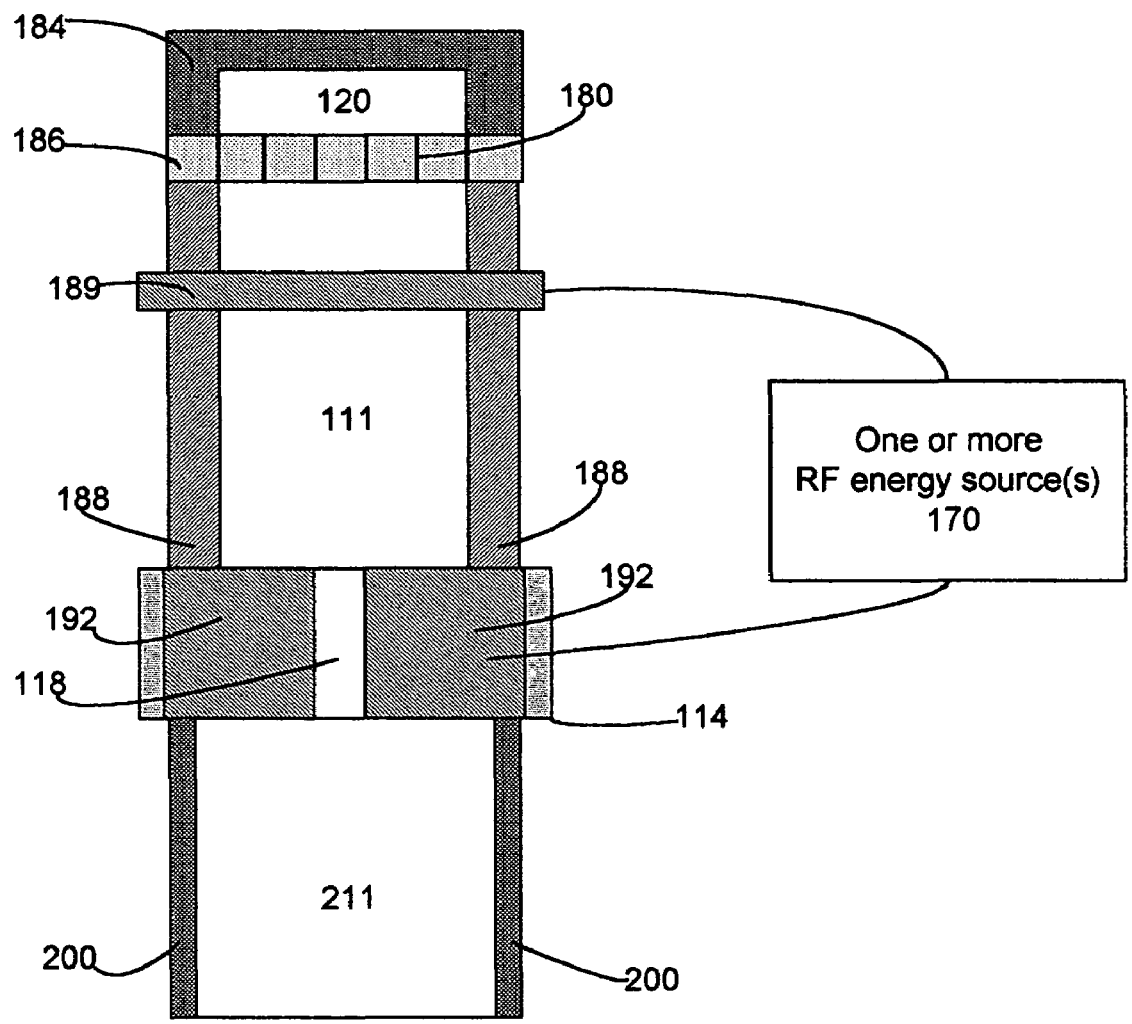
FIG. 2D illustrates a schematic cross-section of downstream plasma apparatus in accordance with an alternative embodiment of the invention, which has a discharge chamber, which also has a dielectric layer between the discharge chamber and a first electrode and a second electrode that are connected to one or more RF energy sources.

In FIG. 2D, metal or dielectric material 184 encloses a gas inlet 120 which supplies one or more gases to discharge chamber 111 enclosed within dielectric material 188. Small openings 180 in material 186 (comprising an optional metal electrode or dielectric material) prevent plasma expansion upstream from discharge chamber 111 through gas inlet 120. Discharge chamber 111 also has a first electrode 189 (e.g., a metallic band enclosing discharge chamber 111) and a second electrode 192 that are connected to one or more RF energy sources 170. Dielectric material 188 separates first electrode 189 and second electrode 192. One or more RF energy sources 170 provide the power to dissociate one or more gases passing through discharge chamber 111. Discharge chamber 111 is coupled to a second chamber 211 by constriction 118 (to achieve a high power density plasma) and second electrode 192 within output port 114. The second discharge chamber 211 in alternative embodiments can be constructed with walls 200 made of various materials (e.g., a metal, or a dielectric material such as, ceramic, glass, or an equivalent). Constriction 118 in one embodiment is within a removable insert, which can allow the constriction 118 to be disposable, easier to clean, and/or within a different material than the discharge chamber material. The material for constructing constriction 118 can include material either reactive or un-reactive with the plasma, in alternative embodiments.

Figure 2E:
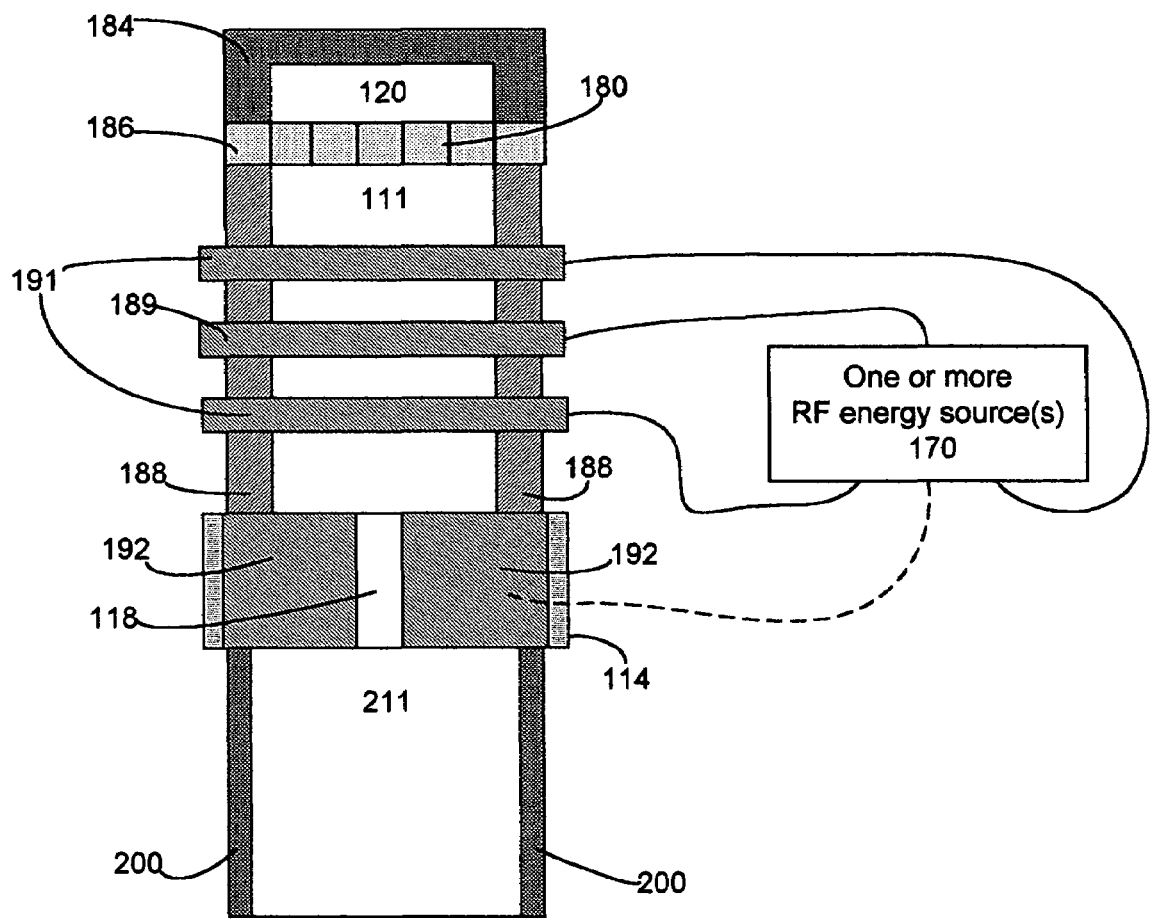
FIG. 2E illustrates a schematic cross-section of downstream plasma apparatus in accordance with an alternative embodiment of the invention, which has a discharge chamber, which also has a dielectric layer between the discharge chamber and a first electrode and a second electrode that are connected to one or more RF energy sources.

In FIG. 2E, metal or dielectric material 184 encloses a gas inlet 120 which supplies one or more gases to discharge chamber 111 enclosed within dielectric material 188. Small openings 180 in material 186 (comprising a dielectric material, or optional metal electrode in an alternative embodiment) prevent plasma expansion upstream from discharge chamber 111 through gas inlet 120. Discharge chamber 111 also has first electrode 189 (e.g., one or more conducting bands enclosing chamber 111) and second electrode 191 (e.g., a plurality of metallic bands enclosing discharge chamber 111) that are connected to one or more RF energy sources 170. In an alternative embodiment, optional electrode 192 is connected to one or more RF energy sources as a replacement or supplement to second electrode 191. Dielectric material 188 electrically separates first electrode 189 and second electrode 191. One or more RF energy sources 170 provide the power to dissociate one or more gases passing through discharge chamber 111. Discharge chamber 111 is coupled to a second chamber 211 by constriction 118 (to achieve a high power density plasma) within output port 114. The second discharge chamber 211 in alternative embodiments can be constructed with walls 200 made of various materials (e.g., a metal, or a dielectric material such as, ceramic, glass, or an equivalent). Constriction 118 in one embodiment is within a removable insert, which can allow the constriction 118 to be disposable, easier to clean, and/or within a different material than the discharge chamber material. The constriction 118 can include material either reactive or un-reactive with the plasma, in alternative embodiments.

Figure 3:
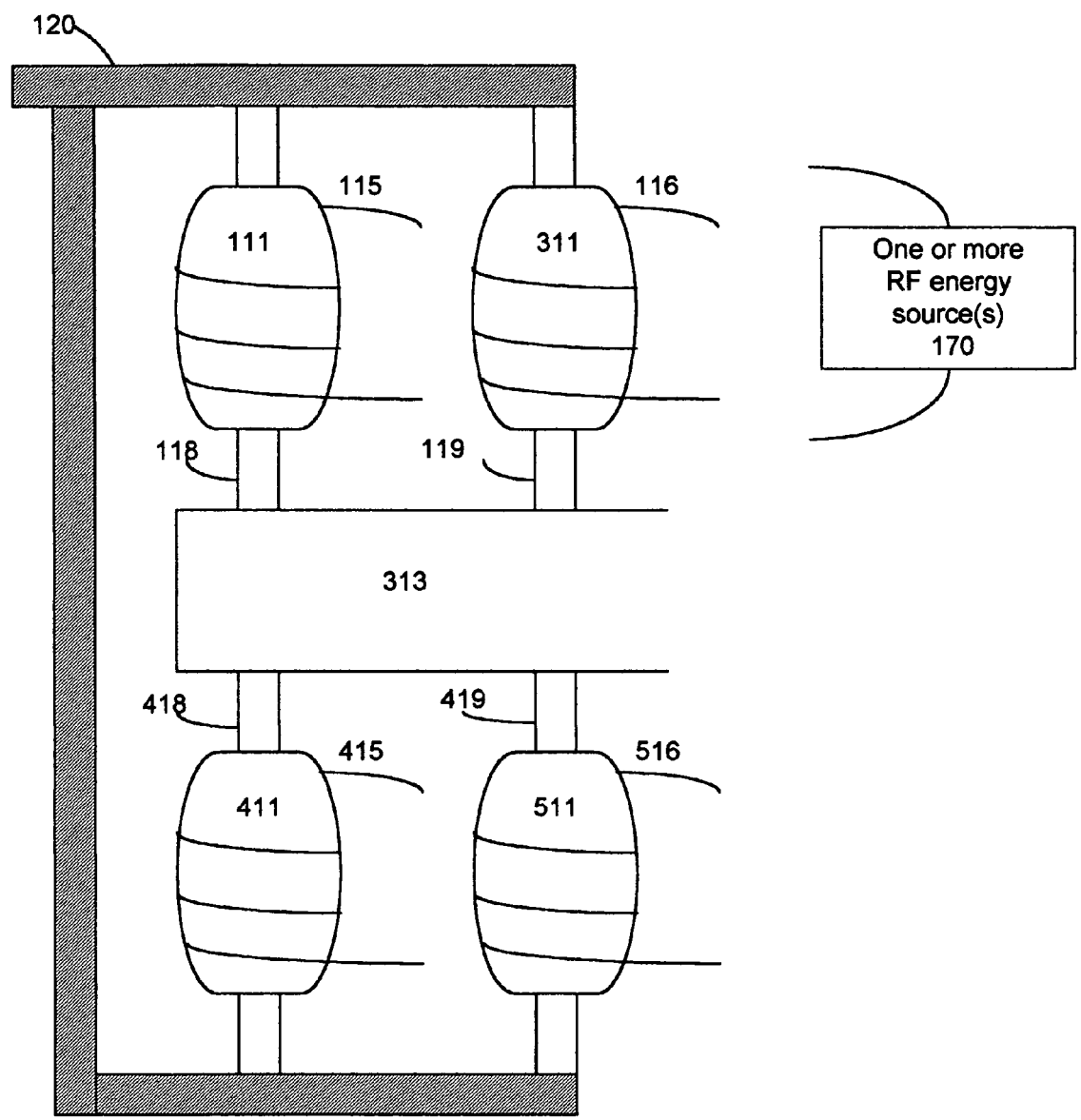
FIG. 3 illustrates a plasma generating apparatus, in accordance with one embodiment of the invention, in which a gas inlet provides one or more gases to a plurality of discharge chambers, which are coupled to a chamber.

In FIG. 3, gas inlet 120 provides one or more gases to discharge chambers 111, 311, 411, and 511, which are coupled to chamber 313 for combining the one or more gases from the chambers 111, 311, 411, and 511, and supplying one or more gases to chamber 313. One or more RF energy sources 170 provide the power for the plurality of discharge chambers, connected to the discharge chambers 111, 311, 411, and 511 individually (allowing independent operation of the discharge chambers) or connected to the discharge chambers 111, 311, 411, and 511 as a group (connections are not shown). Inductor 115 surrounds discharge chamber 111 and dissociates the gas passing through chamber 111. Similarly, inductor 116 surrounds discharge chamber 311 and dissociates the gas passing through chamber 311. Similarly, inductors 415 and 516 surround discharge chambers 411 and 511, respectively and dissociate the one or more gases passing through chambers 411 and 511, respectively. Discharge chamber 111 is coupled to chamber 313 by constriction 118 and discharge chamber 311 is coupled to chamber 313 by constriction 119. Discharge chamber 411 is coupled to chamber 313 by constriction 418 and discharge chamber 511 is coupled to chamber 313 by constriction 419. The inside diameters of constrictions 118, 119, 418, and 419, and the materials used to construct the constrictions can all be independently selected as desired.

Figure 4:
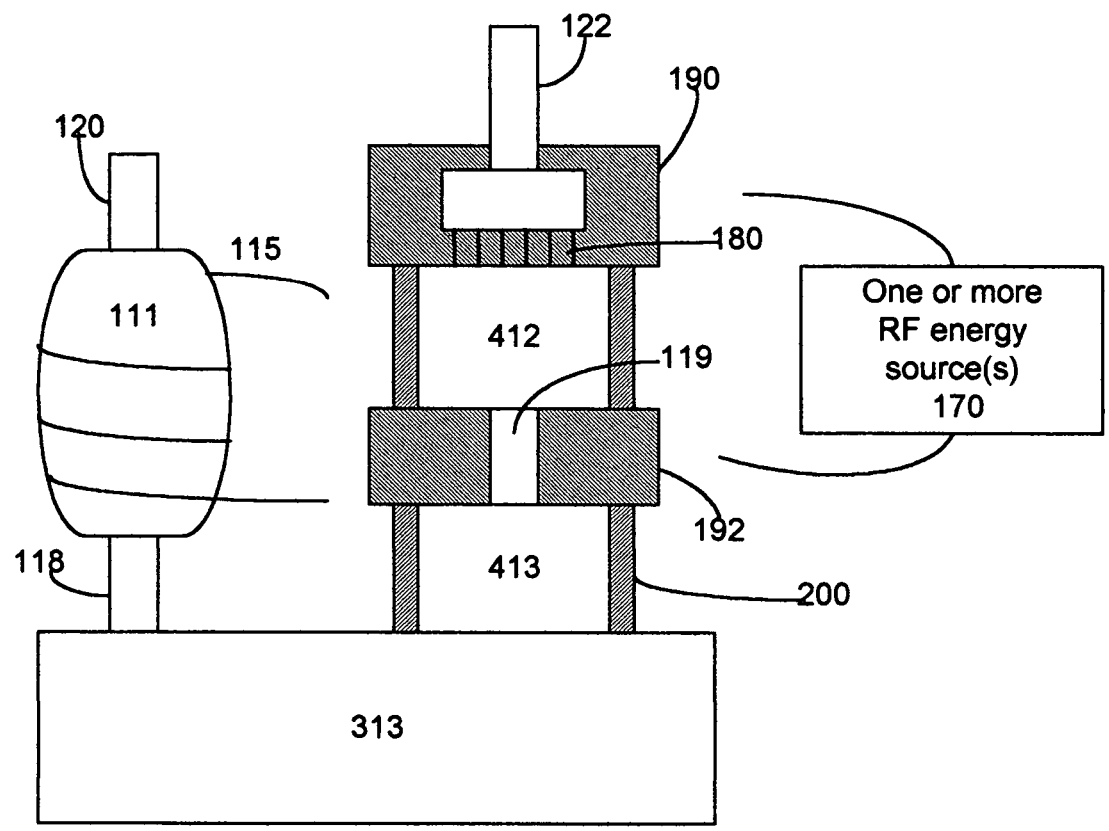
FIG. 4 illustrates a plasma generating apparatus, in accordance with an alternative embodiment of the invention, in which different types of discharge chambers operate in parallel or independently, and are coupled to a chamber for combining the one or more gases from the discharge chambers.

In FIG. 4, gas inlets 120 and 122 each provide one or more gases to discharge chambers 111 and 412, respectively, which are coupled to chamber 313 for combining the plasma from the chambers 111 and 412 (through chamber 413). Small openings 180 prevent plasma expansion upstream from chamber 412. Inductor 115 surrounds discharge chamber 111 and dissociates the gas passing through chamber 111. Similarly, a first electrode 190 and a second electrode 192, isolated by dielectric 200, surround discharge chamber 412 and dissociate the gas passing through chamber 412. One or more RF energy source(s) 170 supply the power to each discharge chamber, connected either in parallel or independently (connections are not shown). Independent operation of each discharge chamber (such as, using different RF frequencies, different power levels ranging from tens to thousands of watts, and equivalent attributes) permit fast changes in plasma composition by simply varying the power levels in alternative embodiments of the invention. Discharge chamber 111 is coupled to chamber 313 by constriction 118 and discharge chamber 412 is coupled to chamber 413 by constriction 119. The inside diameters of constrictions 118 and 119 and the materials used to construct the constrictions 118 and 119 can all be independently selected as desired. The materials used to construct the constrictions 118 and 119 can be selected to be reactive or non-reactive with the plasma to which they are exposed.

When un-compatible chamber material and gas types occur (such as quartz and fluorine gas) multiple plasma sources can be used to dissociated each gas independently and the exhaust gas is combined to provide the desired mix of chemicals, such as in FIG. 4.

Figure 5:
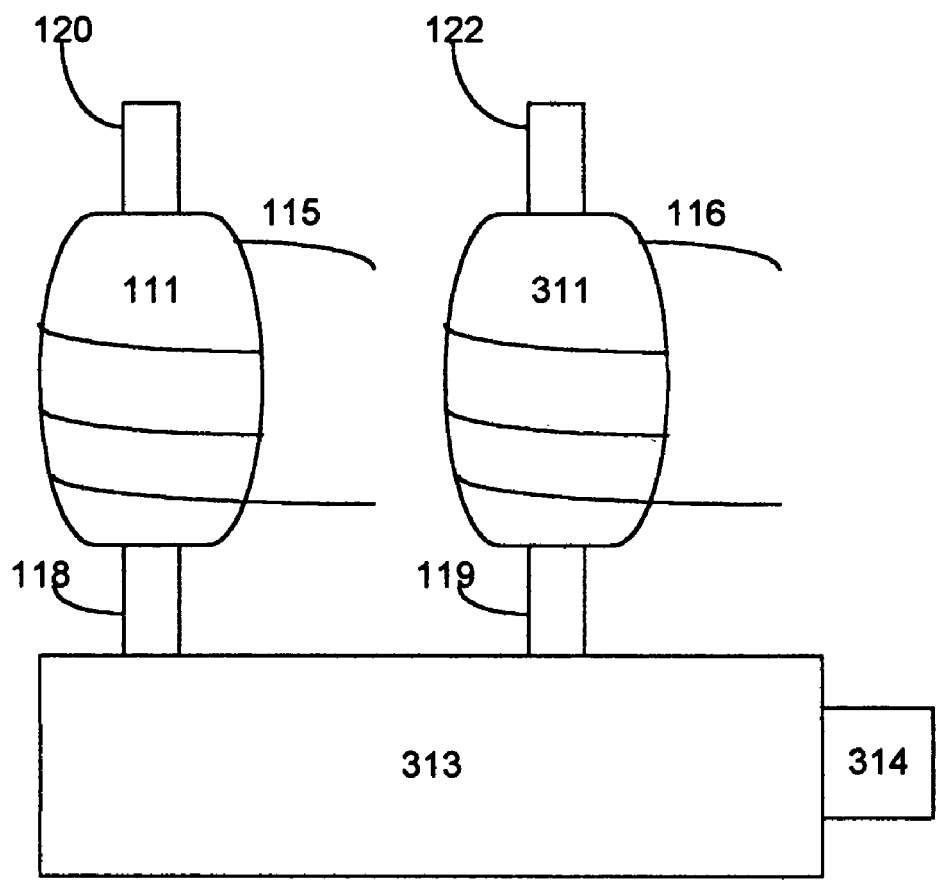
FIG. 5 illustrates a plasma generating apparatus, in accordance with an alternative embodiment of the present invention, where two identical discharge chambers are coupled to a chamber for combining the plasmas from the discharge chambers.
Figure 8:
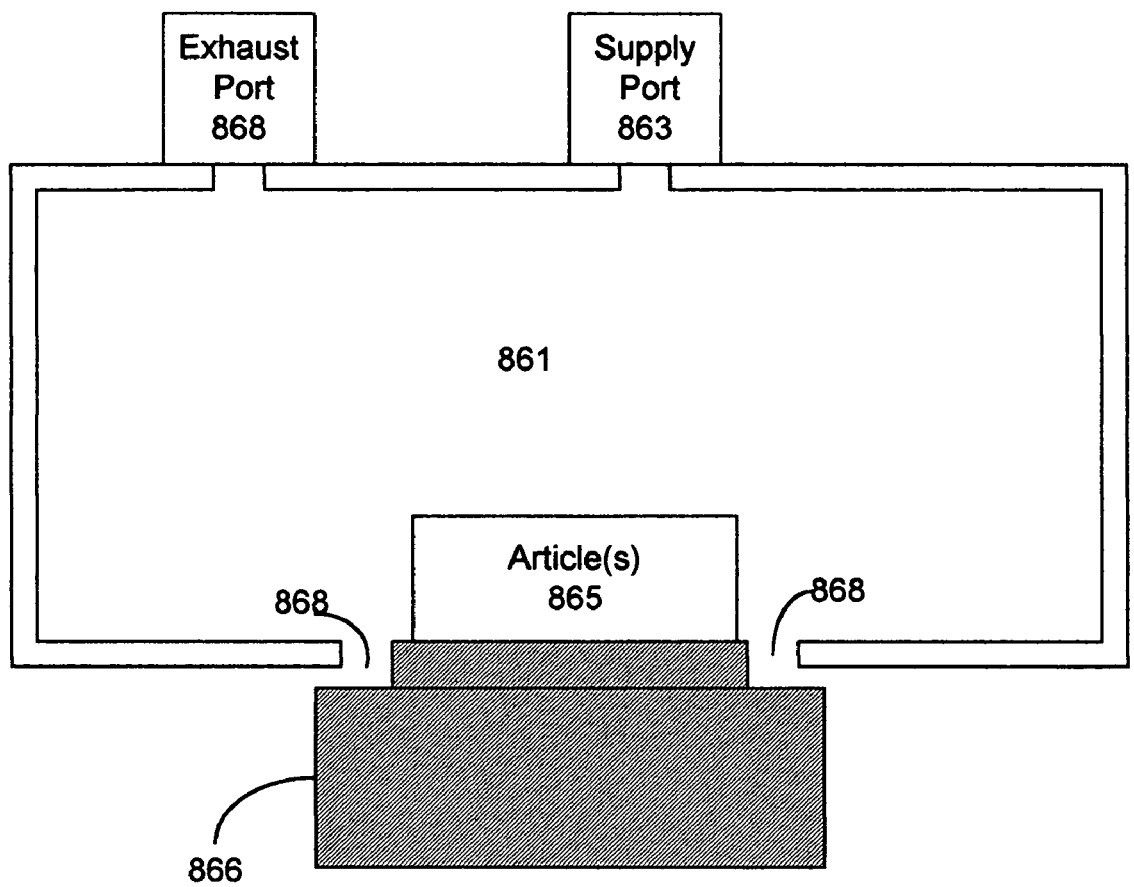
FIG. 8 illustrates a schematic cross-section of a chamber for processing one or more articles, in accordance with another embodiment of the invention.

In FIG. 5, gas inlets 120 and 122 provide one or more gases to discharge chambers 111 and 311 which are coupled to chamber 313 for combining the plasma from the discharge chambers 111 and 311 and supplying plasma to chamber 313. Inductor 115 surrounds discharge chamber 111 and dissociates the gas passing through chamber 111. Similarly, inductor 116 surrounds discharge chamber 311 and dissociates the gas passing through chamber 311. The RF power is supplied to inductors 115 and 116 by one or more RF energy sources (not shown). Discharge chamber 111 is coupled to chamber 313 by constriction 118 and discharge chamber 311 is coupled to chamber 313 by constriction 119. The reactive ionic species and neutral species flow through constrictions 118 and 119 into chamber 313, where they mix and pass through port 314 to a treatment chamber, such as shown in FIG. 8. The inside diameters of constrictions 118 and 119, and the materials used to construct the constrictions 118 and 119, can all be independently selected as desired. FIG. 5 illustrates an embodiment of the invention in which the discharge chambers are essentially operating in parallel when inductors 115 and 116 are connected together to the same RF energy source(s). In an alternative embodiment, inductors 115 and 116 are connected to different RF energy source(s) to operate independently.

In operation, a gas (e.g., an oxygen-based or halogen-based gas, or an equivalent gas) is supplied to discharge chamber 111 from a suitable source (not shown) and discharge chambers 111 and 311 are optionally supplied with one or more other gases from a suitable source (not shown). The flow of gases in each discharge chamber is limited by the size of the constriction and the need to maintain a pressure of few tenths of a Torr to few tens of Torrs. When one discharge chamber alone cannot handle the total flow required then additional discharge chambers are placed in parallel to satisfy the preceding requirement. The composition of the one or more gases can be changed while keeping the total flow constant. A mixture of 1 percent to 99 percent of an oxygen-based, a halogen-based gas, or an equivalent gas can be appropriate for various applications of alternative embodiments of the invention.

RF power from one or more RF energy sources (not shown) is coupled to the discharge chambers 111 and 311 by inductors 115 and 116. It has been found that an applied power of as little as 10 watts per discharge chamber is sufficient to dissociate one or more gases. The gases dissociate, forming reactive ionic species and reactive neutral species, and flow through constrictions 118 and 119 into chamber 313 where they mix and pass through output port 114 to a treatment chamber, such as shown in FIG. 8.

The length of the tubing or piping between chambers does not appear to be critical but the length, inside diameter, and the material of the inner part of the tube can increase the pressure in the discharge chamber and decrease the amount of reactive neutrals available. Gas flow per tube can typically range from a few standard cubic centimeters (sccm) to thousands of sccm in alternative embodiments of the invention.

Figure 6:
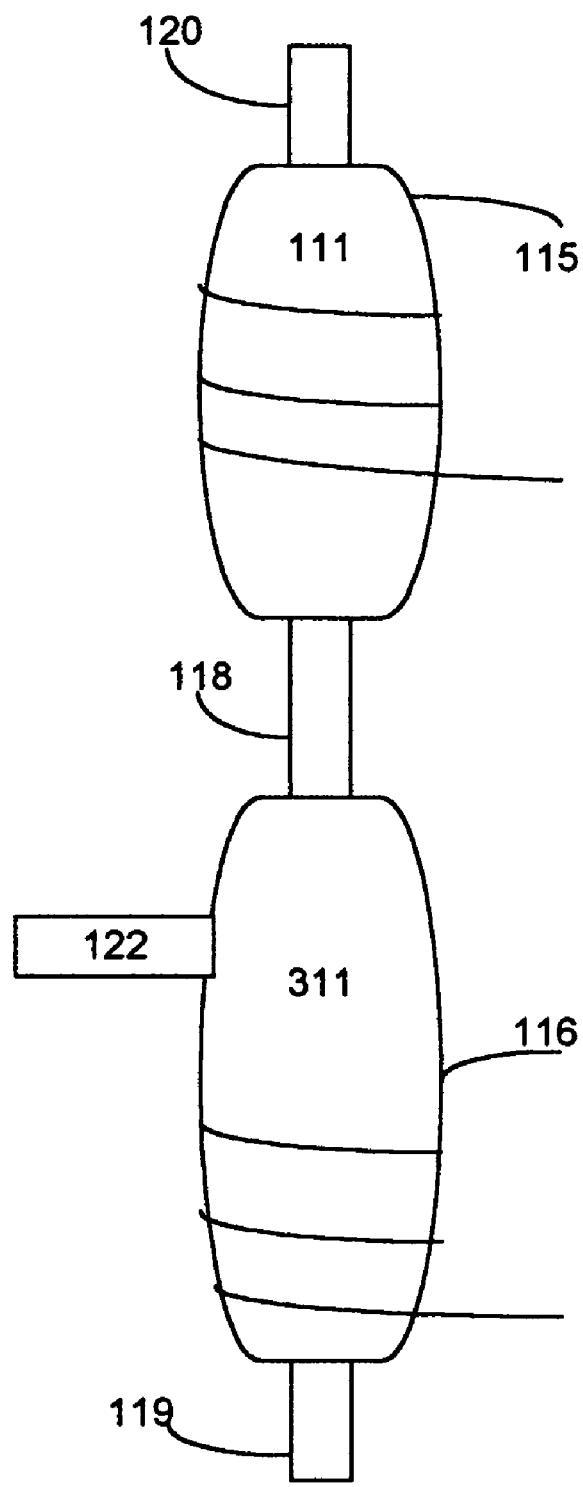
FIG. 6 illustrates an alternative embodiment of the invention in which the discharge chambers operate in series.

FIG. 6 illustrates an alternative embodiment of the invention in which the discharge chambers operate in series. One or more reactive gases are supplied to discharge chamber 111 and dissociated by RF power coupled through inductor 115 to pass through constriction 118 coupled to discharge chamber 311. One or more other gases are supplied through port 122 to discharge chamber 311 where the one or more gases are dissociated by the RF power from inductor 116 and exhausted through constriction 119. The RF power is supplied to inductors 115 and 116 individually or as a group by one or more RF energy sources (not shown). In one embodiment of the invention, the power applied to each of the inductors 115 and 116 is typically less than 100 watts, but a larger power could be used in alternative embodiments of the invention.

In accordance with one alternative embodiment of the invention, inductor 116 is eliminated and the power applied to inductor 115 can range from as little as 10 watts to thousands of watts. When using a single inductor, the energy supplied to the reactive gas is coupled by the reactive gas to another gas, dissociating the other gas in discharge chamber 311. One or more gases are withdrawn through constriction 119 to a treatment chamber (such as shown in FIG. 8).

FIG. 6 illustrates an alternative embodiment of the invention in which one or more gases are supplied to discharge chamber 111 through input port 120. One or more additional gases are supplied to discharge chamber 311 through input port 122. Discharge chamber 111 is coupled to discharge chamber 311 by constriction 118. In one embodiment of the invention, the inside diameter of constriction 119 is larger than or equal to the inside diameter of constriction 118. It appears that the plasma is most active at the constriction rather than being centered within the inductors.

The location of the most active portion of the plasma provides a visual check for assuring proper operation of the apparatus. The location of the most active region can be used to determine the optimum size of the constriction in the reactive gas supply. If the plasma appears most active within the discharge chamber rather than near the constriction, the constriction on the discharge chamber is too large.

Figure 7:
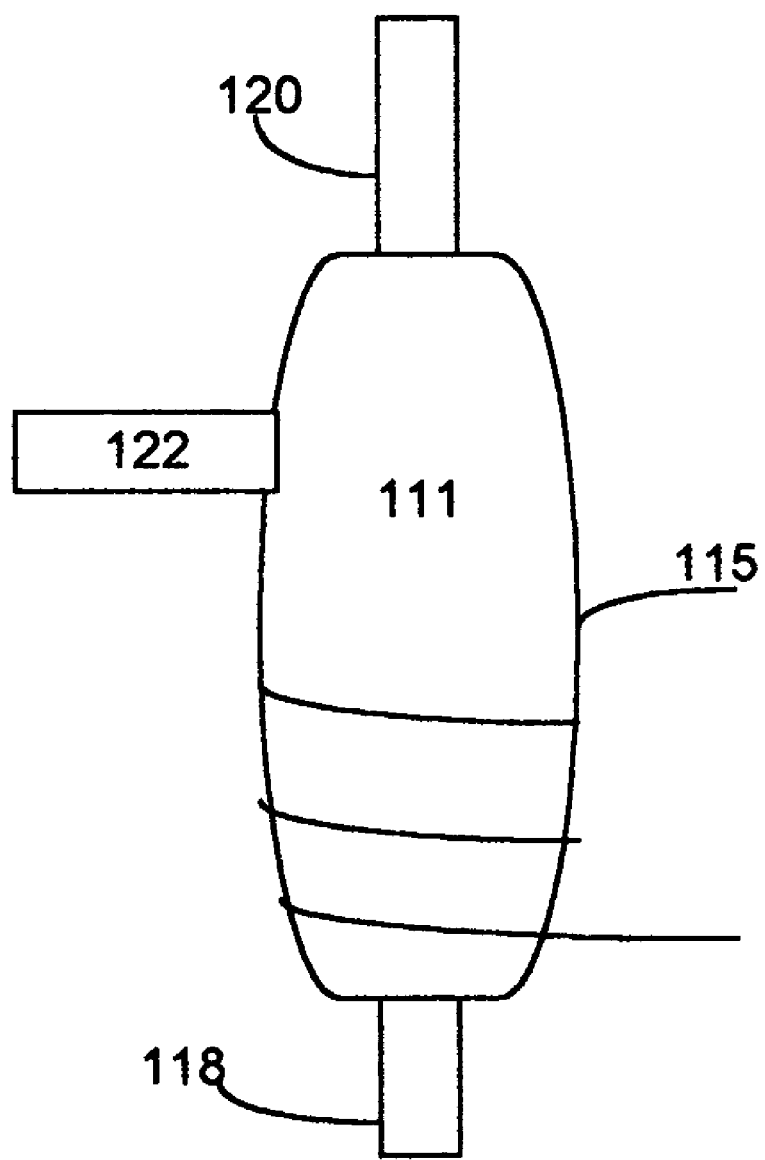
FIG. 7 illustrates an alternative embodiment of the invention in which one or more reactive gases and another gas are supplied to a single discharge chamber.

FIG. 7 illustrates an alternative embodiment of the invention in which one or more reactive gases and another gas are supplied to a single discharge chamber. In FIG. 7, one or more reactive gases are supplied to discharge chamber 111 through input port 120. One or more additional gases are supplied to discharge chamber 111 through input port 122. RF power is coupled to within the discharge chamber 111 by inductor 115 and an adequate power is applied for dissociation of the one or more reactive gases. The RF power is supplied to inductor 115 by one or more RF energy sources (not shown). The output from chamber 111 includes constriction 118 and the one or more dissociated gases are withdrawn from discharge chamber 111 through constriction 118. In one embodiment of the invention, constriction 118 has an inside diameter selected for operating discharge chamber 111 at a pressure ranging from approximately 0.2 Torr to several tens of Torr.

FIG. 8 is a schematic cross-section of a chamber 861 for processing one or more articles. Chamber 861 includes one or more supply ports, such as supply port 863, for receiving one or more dissociated gases and distributing them uniformly over article(s) 865 on platen 866. In an alternative embodiment of the invention, platen 866 and/or chamber 861 are temperature-controlled to control the temperature of the article(s) 865. Gases are removed from chamber 861 by a suitable vacuum pump (not shown) through one or more exhaust ports 868. In an alternative embodiment of the invention, chamber 861 itself contains a plasma (not shown) generated directly in chamber 861, in addition to plasma supplied from other chambers.

The invention thus provides apparatus for efficiently dissociating one or more reactive gases in a plasma to provide reactive ionic and neutral species, without contaminating the sources of the one or more reactive gases. In one embodiment of the invention, an effective amount of reactive species is obtained from a mixture of a reactive gas (e.g., an oxygen-based gas or a halogen-based gas, or an equivalent) and another gas at an applied power as low as 10 watts.

It will be apparent to those of skill in the art that various modifications can be made in terms of supplying the energy to dissociate the gases and produce plasma. As shown, RF power can be capacitively coupled, rather than inductively coupled, to one or more discharge chambers. Virtually any gas or mixture of gases can be dissociated at sufficient power densities in alternative embodiments of the invention.

A constriction from a removable insert provides great flexibility. One or more elements can be selectively released from material included in the insert. For example, sometimes it may not be possible to use a fluorinated gas as a process gas. If the gas discharge uses an oxygen-based gas and the removable constriction includes Teflon®, it is possible to release fluorine from the Teflon® by applying enough RF power to raise the temperature of the Teflon® and make it react with the activated oxygen to form $COF_2$ in the downstream plasma. The amount of the fluorine released is controlled (in part) by temperature, which can be controlled by the RF power level.

When large gas flow is required, the use of multiple discharge chambers operating in parallel can be used. This reduces the gas flow per chamber and keeps the operating pressure in the optimum range for each chamber. The use of multiple discharge chambers for multiple plasma sources is also beneficial since downstream plasma concentration of neutrals is greater with three 100-watt plasma sources than the concentration of neutrals generated by one 300-watt plasma source. Having independent and multiple discharge chambers also allows a quick change in the plasma composition in the combined downstream plasma by simply varying the power level for one or more selected discharge chambers.

Figure 9:
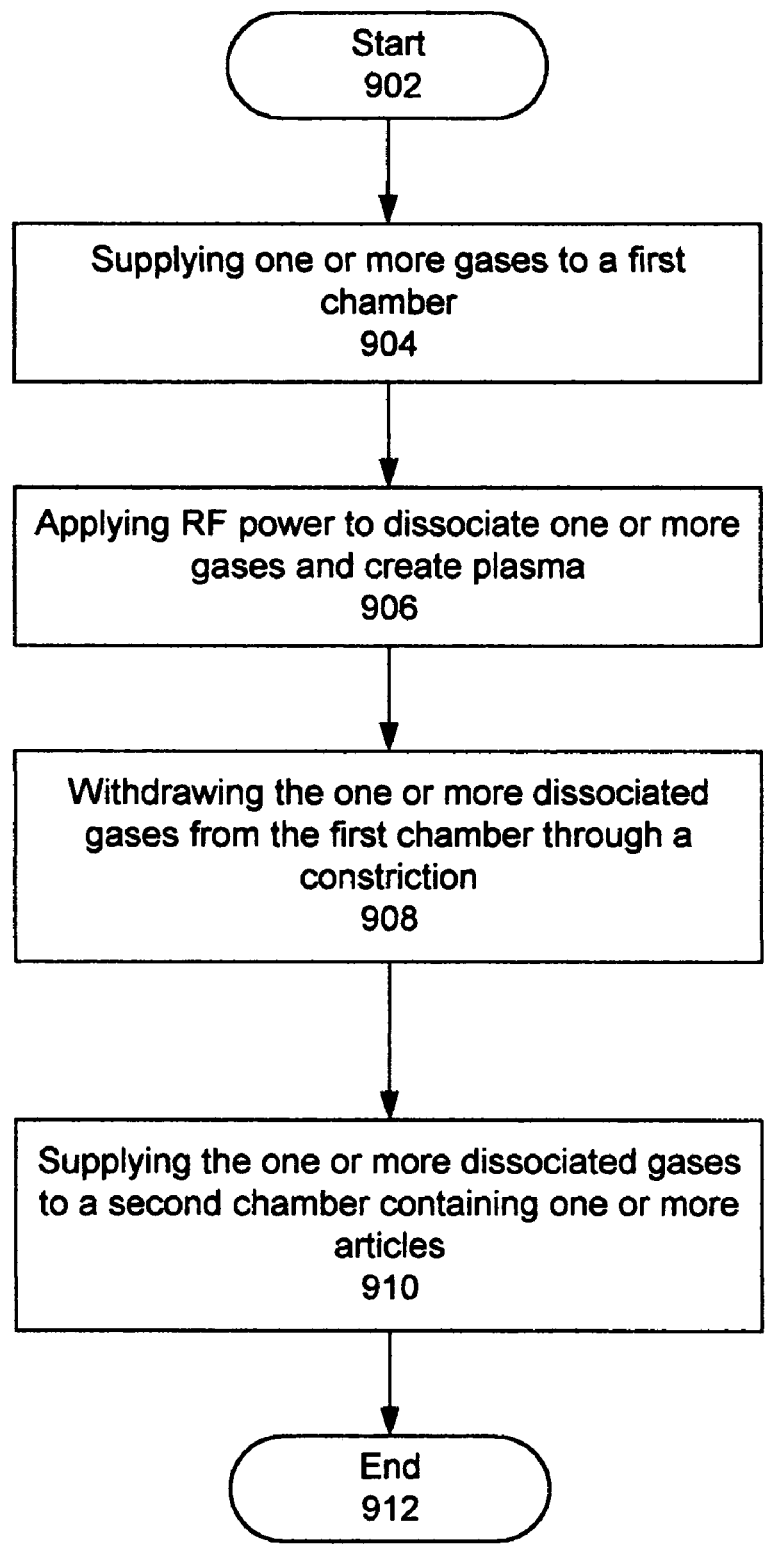
FIG. 9 illustrates a flowchart of a method to provide a higher power density plasma, according to an alternative embodiment of the invention.

FIG. 9 illustrates a flowchart of a method to provide a higher power density plasma, according to one embodiment of the invention. The sequence starts in operation 902. Operation 904 includes supplying one or more gases from a source to a first chamber. This operation in some embodiments of the invention would include using a means for controlling (i.e., reducing or preventing) expansion of plasma back through the source from the first chamber. Operation 906 includes applying RF power to dissociate one or more gases and create plasma. Operation 908 includes withdrawing the one or more dissociated gases from the first chamber through a constriction, where the constriction is sized to increase the power density of the plasma near the constriction. Operation 910 includes supplying the one or more dissociated gases to a second chamber containing one or more articles. The method ends in operation 912. Either fixed or removable inserts composed of the same or different materials as the chamber walls may be used to achieve a constriction.

Figure 10:
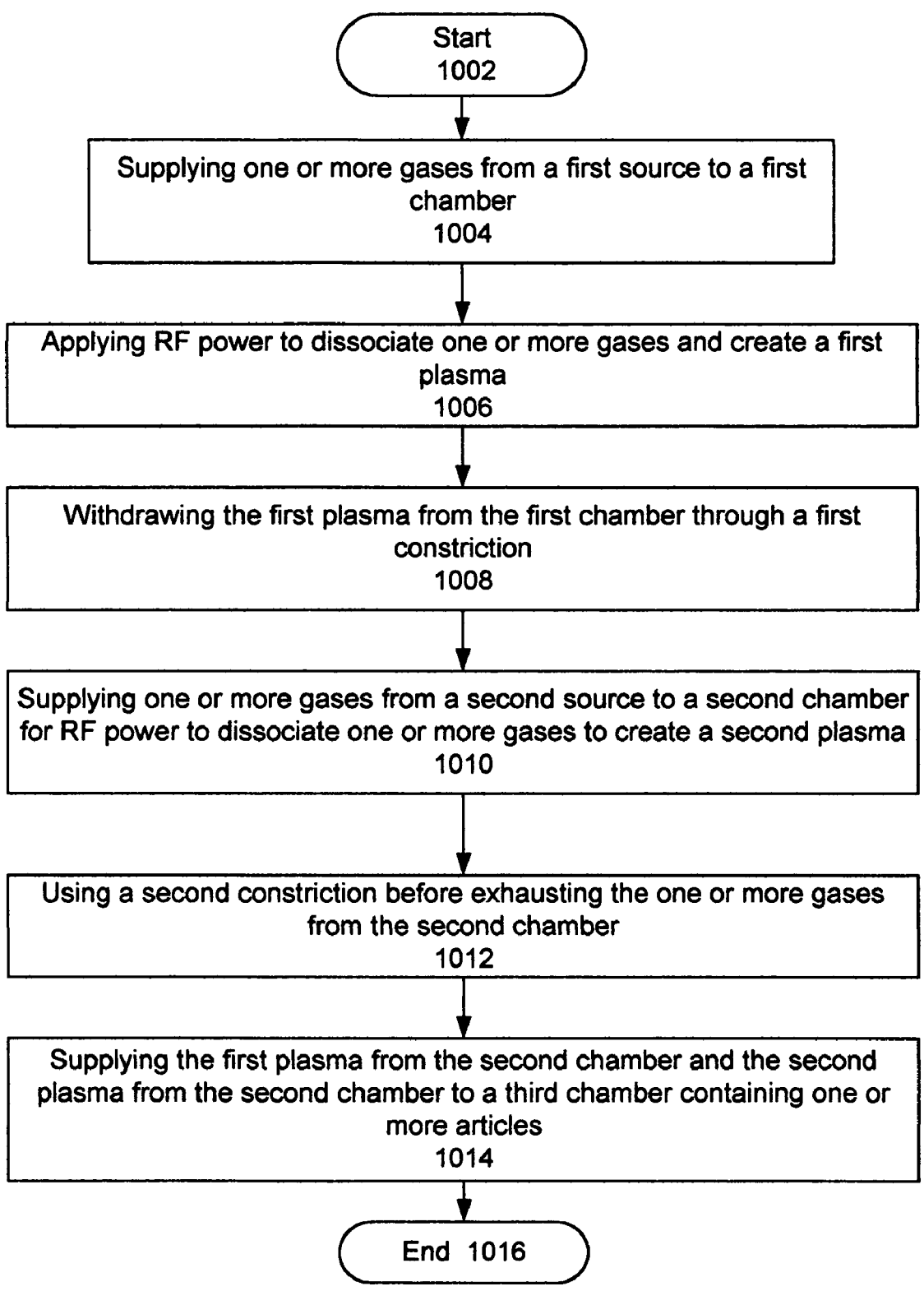
FIG. 10 illustrates a flowchart of a method to provide a higher power density plasma in parallel, according to an alternative embodiment of the invention.

FIG. 10 illustrates a flowchart of a method to provide a higher power density plasma, according to an alternative embodiment of the invention. The sequence starts in operation 1002. Operation 1004 includes supplying one or more gases from a first source to a first chamber. Operation 1004 in some embodiments of the invention would include using a means for controlling (i.e., reducing or preventing) expansion of a plasma back through the first source from the first chamber. Operation 1006 includes applying RF power to dissociate one or more gases and create a first plasma. Operation 1008 includes withdrawing the first plasma from the first chamber through a first constriction, wherein the constriction is sized to increase the power density of the first plasma near the first constriction. Operation 1010 includes supplying one or more gases from a second source to a second chamber for RF power to dissociate one or more gases to create a second plasma. Operation 1012 includes using a second constriction to withdraw the second plasma from the second chamber, wherein the second constriction is sized to increase the power density of the second plasma near the second constriction. Operation 1014 includes supplying the first plasma from the first chamber and the second plasma from the second chamber to a third chamber containing one or more articles. The method ends in operation 1016. Either fixed or removable inserts composed of the same or different materials as the chamber walls may be used to achieve the constrictions. In an alternative embodiment of the invention, an insert can react with plasma to release one or more elements into the plasma. In one embodiment of the invention, the first chamber and second chamber are constructed identically. In an alternative embodiment of the invention, the first chamber and second chamber are constructed differently and use either inductive coupling or capacitive coupling to apply RF power to the chambers.

Figure 11:
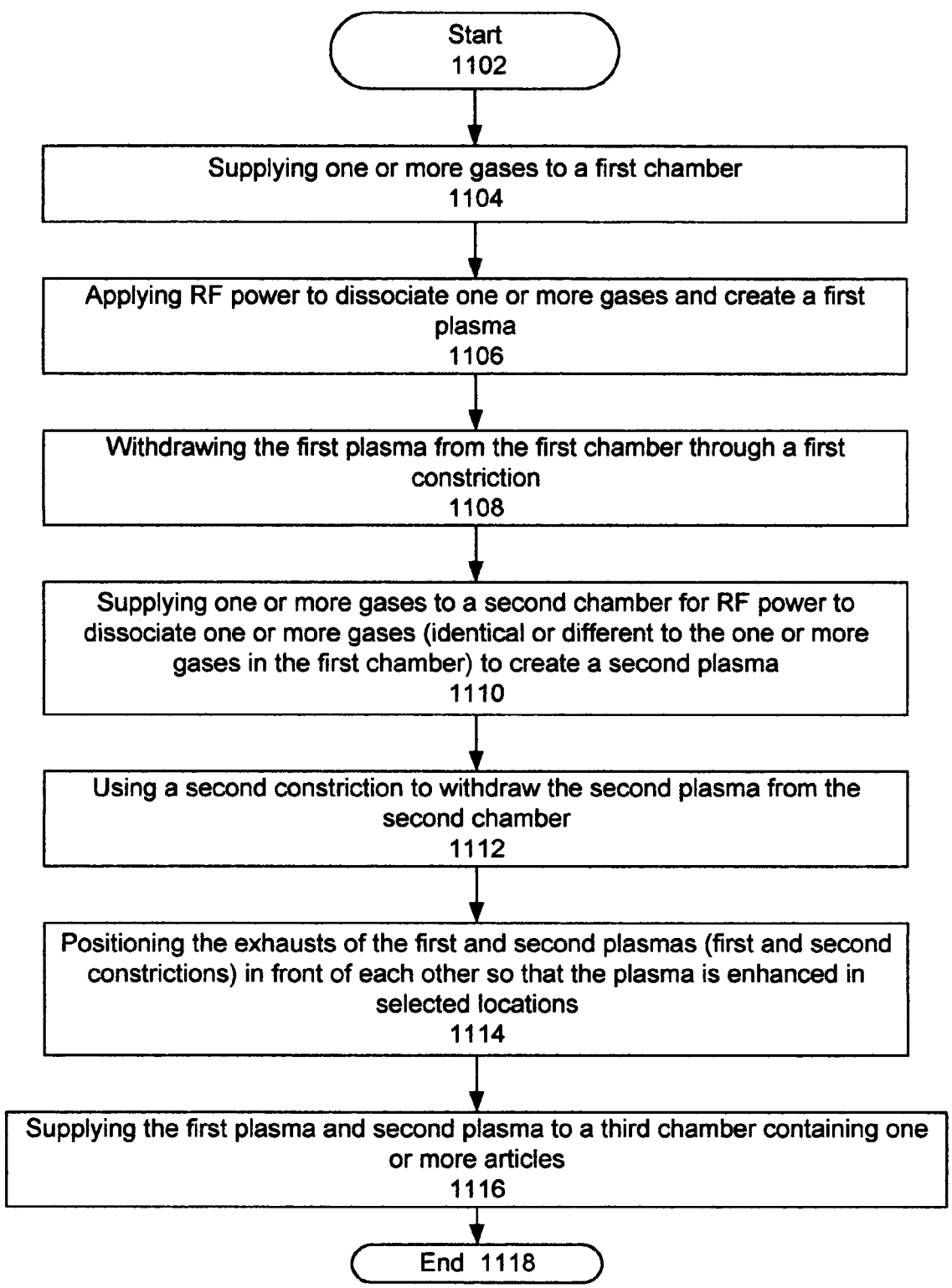
FIG. 11 illustrates a flowchart of a method to provide a higher power density plasma in parallel, according to an alternative embodiment of the invention.

FIG. 11 illustrates a flowchart of a method to provide a higher power density plasma, according to an alternative embodiment of the invention. The sequence starts in operation 1102. Operation 1104 includes supplying one or more gases to a first chamber. Operation 1104 in one embodiment of the invention would include a means for controlling the upstream expansion of the one or more gases. Operation 1106 includes applying RF power to dissociate one or more gases to create a first plasma. Operation 1108 includes withdrawing the first plasma from the first chamber through a first constriction, wherein the constriction is sized to increase the power density of the first plasma near the first constriction. Operation 1110 includes supplying one or more gases to a second chamber for RF power to dissociate one or more gases (identical or different to the one or more gases in the first chamber) to create a second plasma. Operation 1112 includes using a second constriction to withdraw the second plasma from the second chamber, wherein the second constriction is sized to increase the power density of the second plasma near the second constriction. Operation 1114 includes positioning the exhaust of the first and second plasmas (first and second constrictions) in front of each other so that the plasma is enhanced in selected locations. Operation 1116 includes supplying the first plasma and second plasma to a third chamber containing one or more articles. The method ends in operation 1118. Either fixed or removable inserts composed of the same or different materials as the chamber walls may be used to achieve the constrictions. In an alternative embodiment of the invention, one or more inserts include material that can react with plasma to release one or more elements into the plasma. In one embodiment of the invention, the first chamber and second chamber are constructed identically. In an alternative embodiment of the invention, the first chamber and second chamber are constructed differently and use either inductive coupling or capacitive coupling to apply RF power to the chambers.

Figure 12:
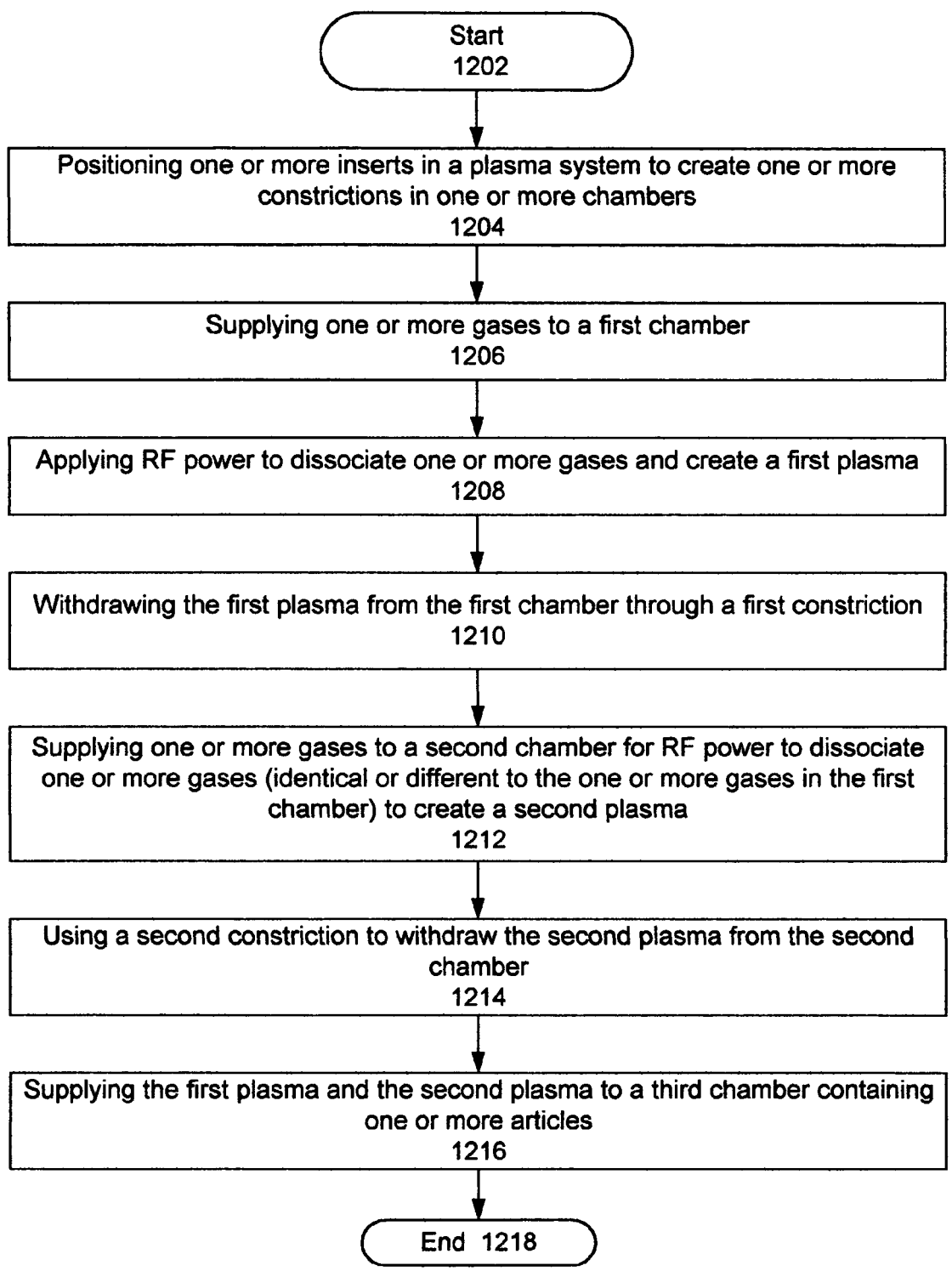
FIG. 12 illustrates a flowchart of a method to provide a higher power density plasma in series, according to an alternative embodiment of the invention.

FIG. 12 illustrates a flowchart of a method to provide a higher power density plasma in series, according to an alternative embodiment of the invention. The sequence starts in operation 1202. Operation 1204 includes positioning one or more inserts in a plasma system to create one or more constrictions in one or more chambers. Either fixed or removable inserts composed of the same or different materials as the chamber walls may be used to achieve the constrictions. Operation 1206 includes supplying one or more gases to a first chamber. Operation 1206 in one embodiment of the invention would include a means for controlling the upstream expansion of the one or more gases. Operation 1208 includes applying RF power to dissociate one or more gases and create a first plasma. Operation 1210 includes withdrawing the first plasma from the first chamber through a first constriction, wherein the constriction is sized to locate high power density plasma near the first constriction. Operation 1212 includes supplying one or more gases to a second chamber in series to the first chamber to dissociate one or more gases (identical or different to the one or more gases in the first chamber) to create a second plasma. Operation 1214 includes using a second constriction to withdraw the second plasma from the second chamber, wherein the second constriction is sized to produce higher power density plasma near the second constriction. Operation 1216 includes supplying the first plasma and second plasma to a third chamber containing one or more articles. The method ends in operation 1218. In an alternative embodiment of the invention, one or more inserts include material that can react with plasma to release one or more elements into the plasma. In an alternative embodiment of the invention, the first chamber and second chamber are constructed differently and use either inductive coupling or capacitive coupling to apply RF power to the chambers.

The exemplary embodiments described herein are for purposes of illustration and are not intended to be limiting. Therefore, those skilled in the art will recognize that other embodiments could be practiced without departing from the scope and spirit of the claims set forth below.

What is claimed is:

1. A method for treating one or more articles with a plasma generated from dissociating one or more gases, said method comprising:
supplying one or more gases from a source to a first chamber, including a means for controlling expansion of a plasma back through said source from said first chamber;
applying RF power to dissociate said one or more gases and create said plasma having a power density;
withdrawing said dissociated one or more gases from said first chamber through at least one constriction, wherein said at least one constriction is sized to increase said power density of said plasma at said at least one constriction; and
supplying said dissociated one or more gases to a second chamber containing said one or more articles.

2. The method of claim 1, wherein a gas mixture is dissociated by the energy in said dissociated one or more gases.

3. The method of claim 1, wherein supplying one or more gases to a first chamber includes using one or more small openings to prevent expansion of said plasma back through said source from said first chamber.

4. The method of claim 1, further comprising:
applying RF power to one or more gases in an additional chamber having a second constriction to dissociate said one or more gases from a second source into a second plasma prior to supplying said second plasma to said second chamber containing one or more articles.

5. The method of claim 1, further comprising:
operating a plurality of plasma sources in parallel, wherein one or more plasma sources of said plurality of plasma sources has at least one constriction with a selected diameter.

6. The method of claim 1, wherein said at least one constriction is achieved by a removable insert.

7. The method of claim 1, wherein said at least one constriction is achieved by an insert including material chosen to react with said plasma to release one or more elements into said plasma.

8. A method for treating one or more articles with plasma generated by dissociating one or more gases, said method comprising:
supplying one or more gases from a first source to a first chamber,
applying RF power to dissociate said one or more gases from said first source to create a first plasma having a first power density;
withdrawing said first plasma from said first chamber through a first constriction to increase said first power density of said first plasma;
supplying one or more gases from a second source to a second chamber for RF power to dissociate said one or more gases from said second source to create a second plasma having a second power density;
using a second constriction to withdraw said second plasma from said second chamber to increase said second power density of said second plasma; and
supplying said first plasma from said first chamber and said second plasma from said second chamber to a third chamber containing said one or more articles.

9. The method of claim 8, wherein said first chamber and said second chamber are supplying said first plasma and second plasma in parallel to said third chamber.

10. The method of claim 8, wherein said first chamber and said second chamber are supplying said first plasma and second plasma in series to said third chamber.

11. The method of claim 8, further comprising:
providing a removable insert in at least one chamber to achieve at least one constriction and a higher power density in proximity to said removable insert.

12. The method of claim 8, further comprising:
positioning said first constriction and said second constriction in proximity to each other to enhance said plasma released into said third chamber.

13. The method of claim 8, wherein at least one constriction is achieved by an insert including material chosen to react with said plasma to release one or more elements into said plasma.

14. An apparatus for dissociating one or more gases to produce a plasma, said apparatus comprising:
a first chamber with at least one constriction, having a first port coupled to a first source of one or more gases, including means for controlling expansion of a plasma in said first chamber back through said first port,
one or more RF energy sources coupled to said first chamber,
means for dissociating said one or more gases in said first chamber into said plasma having a power density, wherein said at least one constriction increases said power density of said plasma in proximity to said at least one constriction, and
a second chamber coupled to said first chamber, wherein said second chamber can contain one or more articles, and said second chamber has an operating pressure above 200 milliTorr.

15. The apparatus of claim 14, wherein said means for dissociating said one or more gases includes a first inductor coupling RF energy to said one or more gases in said first chamber.

16. The apparatus of claim 14, wherein said means for dissociating said one or more gases includes a first electrode and a second electrode to capacitively couple RF energy to within said first chamber for dissociating said one or more gases.

17. The apparatus of claim 14, wherein said means for controlling expansion of said plasma in said first chamber back through said first port uses one or more small openings.

18. The apparatus of claim 14, wherein said at least one constriction is provided by at least one removable insert.

19. The apparatus of claim 18, wherein said at least one removable insert includes material that selectively reacts to release one or more elements into said one or more gases during dissociation of said one or more gases.

20. An apparatus to dissociate one or more gases to produce plasma, said apparatus comprising:
a first chamber with a first constriction, having a first port coupled to a first source of one or more gases, including means for controlling expansion of a plasma in said first chamber back through said first port,
a second chamber with a second constriction, having a second port coupled to a second source of one or more gases, including means for controlling expansion of a plasma in said second chamber back through said second port,
one or more RF energy sources coupled to said first chamber and said second chamber,
means for dissociating said one or more gases from said first port into a first plasma having a first power density in said first chamber, wherein said first constriction increases said first power density,
means for dissociating said one or more gases from said second port into a second plasma having a second power density in said second chamber, wherein said second constriction increases said second power density, and
a third chamber coupled to said first chamber and said second chamber, wherein said third chamber can contain one or more articles, and said third chamber has an operating pressure above 200 milliTorr.

21. The apparatus of claim 20, wherein said means for dissociating said one or more gases includes a first inductor coupling RF energy to said one or more gases in said first chamber.

22. The apparatus of claim 20, wherein said means for dissociating said one or more gases from said first port into said first plasma in said first chamber is different to said means for dissociating said one or more gases from second port into said second plasma in said second chamber.

23. The apparatus of claim 20, wherein said means for dissociating said one or more gases includes a first electrode and a second electrode to capacitively couple RF energy to Within said first chamber for dissociating said one or more gases.

24. The apparatus of claim 20, wherein said means for controlling expansion of a plasma includes a material having one or more small openings.

25. The apparatus of claim 20, wherein at least one constriction is created by at least one insert that is removable.

26. The apparatus of claim 25, wherein said at least one insert includes material that selectively reacts to release one or more elements into said one or more gases during dissociation of said one or more gases.

27. The apparatus of claim 20, wherein said first chamber and said second chamber supply said first plasma and said second plasma in parallel to said third chamber.

28. The apparatus of claim 20, wherein said first chamber and said second chamber supply said first plasma and said second plasma in series to said third chamber.

* * * * *